United States Patent
Jang et al.

(10) Patent No.: US 9,935,288 B2
(45) Date of Patent: Apr. 3, 2018

(54) ORGANIC LIGHT-EMITTING ELEMENT

(71) Applicant: LG DISPLAY CO., LTD., Seoul (KR)

(72) Inventors: Junhyuk Jang, Daejeon (KR); Yeon Keun Lee, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/310,331

(22) PCT Filed: May 15, 2015

(86) PCT No.: PCT/KR2015/004926
§ 371 (c)(1),
(2) Date: Nov. 10, 2016

(87) PCT Pub. No.: WO2015/174796
PCT Pub. Date: Nov. 19, 2015

(65) Prior Publication Data
US 2017/0141344 A1    May 18, 2017

(30) Foreign Application Priority Data

May 15, 2014 (KR) .................. 10-2014-0058343
May 15, 2014 (KR) .................. 10-2014-0058351

(51) Int. Cl.
*H01L 51/52*    (2006.01)
(52) U.S. Cl.
CPC ...... *H01L 51/5212* (2013.01); *H01L 51/5228* (2013.01); *H01L 51/5268* (2013.01); *H01L 2251/5338* (2013.01); *H01L 2251/5392* (2013.01)

(58) Field of Classification Search
CPC ............ H01L 27/3276; H01L 27/3288; H01L 27/3297; H01L 51/5212; H01L 51/5228
See application file for complete search history.

(56) References Cited

U.S. PATENT DOCUMENTS

2003/0006697 A1* 1/2003 Weaver ............... H01L 27/3246
                                                                 313/503
2005/0225234 A1    10/2005 Tyan et al.
(Continued)

FOREIGN PATENT DOCUMENTS

JP    2001-338770 A    12/2001
JP    2009-283304 A    12/2009
(Continued)

*Primary Examiner* — Bryan Junge
(74) *Attorney, Agent, or Firm* — Dentons US LLP

(57) ABSTRACT

An embodiment of the present specification provides an organic light emitting device including: a first electrode; a second electrode provided opposite to the first electrode; one or more organic material layers provided between the first electrode and the second electrode; an auxiliary electrode provided in the first electrode; and a short circuit prevention layer provided between the first electrode and the auxiliary electrode, wherein the short circuit prevention layer has a resistance value which is greater at 50 or more ° C. than 25° C. The organic light emitting device controls the amount of leakage current when a short circuit defect occurs, thereby solving a problem where a device does not overall operate. The organic light emitting device stably operates without an increase in the amount of leakage current.

18 Claims, 3 Drawing Sheets

(56) References Cited

U.S. PATENT DOCUMENTS

| | | | |
|---|---|---|---|
| 2006/0033427 A1* | 2/2006 | Nagayama | H01L 51/50 313/506 |
| 2006/0066223 A1* | 3/2006 | Pschenitzka | H01L 51/50 313/504 |
| 2011/0101396 A1* | 5/2011 | Kim | H01L 51/5271 257/98 |
| 2012/0205679 A1* | 8/2012 | Hiroki | H01L 27/3202 257/88 |
| 2013/0140550 A1 | 6/2013 | Lee et al. | |
| 2014/0104530 A1* | 4/2014 | Xi | G02F 1/136286 349/43 |

FOREIGN PATENT DOCUMENTS

| | | |
|---|---|---|
| KR | 10-2006-0130729 | 12/2006 |
| KR | 10-2012-0016027 | 2/2012 |
| KR | 10-2013-0126270 A | 11/2013 |

\* cited by examiner

ORGANIC LIGHT-EMITTING ELEMENT

This application is a National Stage Entry of International Application No. PCT/KR2015/004926, filed May 15, 2015, and claims the benefit of and priority to Korean Application No. 10-2014-0058343, filed on May 15, 2014 and Korean Application No. 10-2014-0058351, filed on May 15, 2014 all of which are hereby incorporated by reference in their entirety for all purposes as if fully set forth herein.

TECHNICAL FIELD

This application claims the benefit of the Korean Patent Application Nos. 10-2014-0058343 filed on May 15, 2014, and 10-2014-0058351 filed on May 15, 2014, which are hereby incorporated by reference as if fully set forth herein.

The present specification relates to an organic light emitting device.

BACKGROUND ART

An organic light emitting phenomenon denotes a phenomenon where electrical energy is converted into light energy by using an organic material. That is, in a case where an organic material layer is disposed between an anode and a cathode, when a voltage is applied between the anode and the cathode, the anode injects a hole into the organic material layer, and the cathode injects an electron into the organic material layer. The hole and the electron which are injected into the organic material layer are combined to generate an exciton, and when the exciton is shifted to a ground state, light is emitted.

Since an interval between the anode and the cathode is short, an organic light emitting device is easy to have a short circuit defect. Due to a step in a structure of the organic light emitting device and roughness of coating, the anode can directly contact the cathode, or the short circuit defect can occur because a thickness of an organic layer is progressively thinned in an area where occurrence of the short circuit defect is predicted. The defective region provides a low-resistance path which enables a current to flow, and for this reason, a current can hardly flow or cannot at all flow through the organic light emitting device. Consequently, an output of light emitted from the organic light emitting device is reduced, or light is not emitted from the organic light emitting device. In a multi-pixel display device, the short circuit defect causes a dead pixel which cannot emit light or emits light having intensity less than average light intensity, causing the degradation in display quality. For lighting or a low resolution, due to the short circuit defect, a large portion in a corresponding region cannot operate. In order to prevent the short circuit defect, organic light emitting devices are conventionally manufactured in a clear chamber. However, the short circuit defect is not effectively removed even in a very clear environment. In a method where the number of short circuit defects is reduced by increasing an interval between the anode and the cathode, a thickness of the organic layer further increases than a thickness which is actually necessary to operate a device. Such a method causes an increase in the manufacturing cost of organic light emitting devices, and cannot fully remove the short circuit defect.

PRIOR ART REFERENCE

Korean Patent Publication No. 10-2006-0130729 (published 2006 Dec. 19)

DISCLOSURE

Technical Problem

The inventors are directed to provide an organic light emitting device and a method of manufacturing the same, in which an operation is performed within a normal range even when a short circuit defect occurs due to a cause of the short circuit defect.

Technical Solution

An embodiment of the present specification provides an organic light emitting device including: a first electrode; a second electrode provided opposite to the first electrode; one or more organic material layers provided between the first electrode and the second electrode; an auxiliary electrode provided in the first electrode; and a short circuit prevention layer provided between the first electrode and the auxiliary electrode, wherein the short circuit prevention layer has a resistance value which is greater at 50 or more ° C. than 25° C.

An embodiment of the present specification provides an organic light emitting device including: a first electrode; a second electrode provided opposite to the first electrode; one or more organic material layers provided between the first electrode and the second electrode; an auxiliary electrode of the first electrode; and a short circuit prevention layer provided between the first electrode and the auxiliary electrode, the short circuit prevention layer having a resistance value which increases in proportion to a primary function, a secondary function, or an exponential function according to an increase in temperature.

An embodiment of the present specification provides an organic light emitting device including: a first electrode; a second electrode provided opposite to the first electrode; one or more organic material layers provided between the first electrode and the second electrode; an auxiliary electrode of the first electrode; and a short circuit prevention layer provided between the first electrode and the auxiliary electrode, the short circuit prevention layer including a conductive material and a matrix formed of a composition including a photosensitive polymer.

An embodiment of the present specification provides a display device including the organic light emitting device.

An embodiment of the present specification provides a lighting device including the organic light emitting device.

Advantageous Effect

The organic light emitting device an embodiment of the present specification can normally maintain a function of the organic light emitting device even when a short circuit defect occurs. In detail, the organic light emitting device according to an embodiment of the present specification controls the amount of leakage current even when the short circuit defect occurs, thereby solving a problem where a device does not overall operate.

Moreover, in the organic light emitting device an embodiment of the present specification, even when a size of an area where short circuit occurs increases, the organic light emitting device stably operates without an increase in the amount of leakage current.

MODE FOR INVENTION

Figure 1:
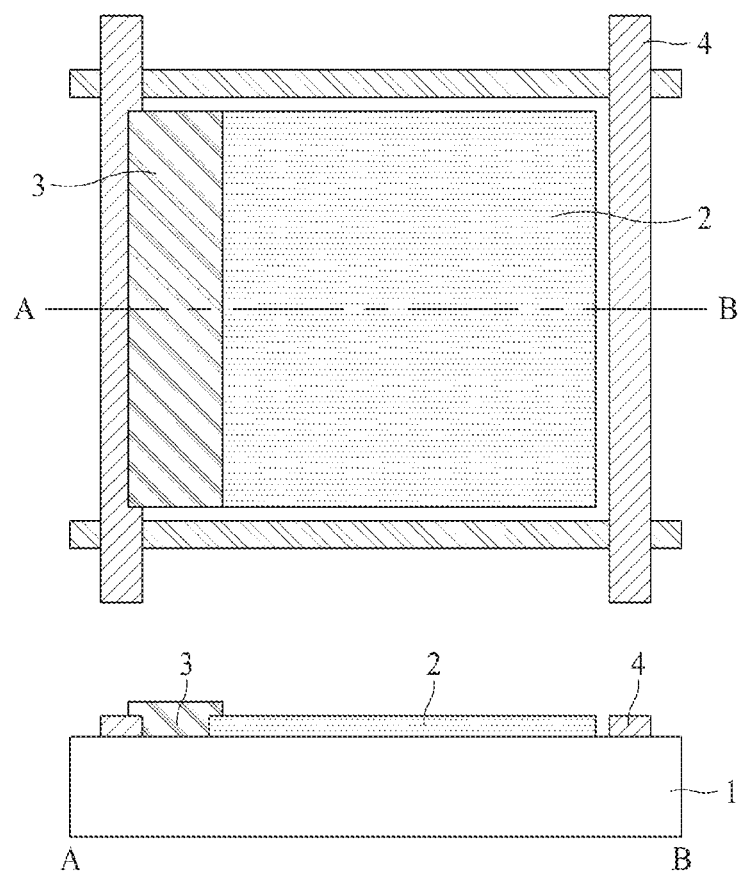
FIG. 1 illustrates a plan view and a cross-sectional view of one conductive unit in an organic light emitting device according to an embodiment of the present specification.

Hereinafter, exemplary embodiments of the present invention will be described in detail with reference to the accompanying drawings.

In this disclosure below, when one element is referred to as being disposed "on" another element, this includes a case where the one element contacts the other element and a case where another element is provided between two elements.

An embodiment of the present specification provides an organic light emitting device including: a first electrode; a second electrode provided opposite to the first electrode; one or more organic material layers provided between the first electrode and the second electrode; an auxiliary electrode of the first electrode; and a short circuit prevention layer provided between the first electrode and the auxiliary electrode, the short circuit prevention layer having a resistance value which is greater at 50 or more ° C. than 25° C.

A general conductor has characteristic where when a temperature increases, a resistance is reduced, and thus, electric conductivity becomes higher. However, the short circuit prevention layer according to an embodiment of the present specification is designed to have a resistance which increases as a temperature increases, and thus, has characteristic different from that of the general conductor.

Moreover, the resistance of the short circuit prevention layer may be measured by connecting a multi-meter between a start point and an end point of the short circuit prevention layer from the auxiliary electrode to the first electrode. Furthermore, a maximum resistance based on a temperature may be measured while heating the short circuit prevention layer based on a temperature with a hotplate and may be graphed.

The short circuit prevention layer prevents a problem where when a short circuit defect occurs in a partial area of the organic light emitting device, a current flows to the partial area where the short circuit defect occurs, and for this reason, the organic light emitting device cannot operate.

A short circuit defect can occur when the second electrode directly contacts the first electrode. Alternatively, the short circuit defect can occur when a function of an organic material layer is lost due to a thickness reduction or modification of the organic material layer disposed between the first electrode and the second electrode, and for this reason, the first electrode and the second electrode contact each other. When the short circuit defect occurs, a current of the organic light emitting device flows to a short circuit defect area which is low in resistance, and for this reason, the organic light emitting device cannot normally operate. The current of the organic light emitting device flows outside a non-defective region due to a leakage current which directly flows from the first electrode to the second electrode due to the short circuit defect. In this case, the emission output of the organic light emitting device is reduced, and in severe cases, the organic light emitting device cannot operate. Also, when a current which distributively flows in the organic material having a wide area concentrates on and flows in a portion where short circuit occurs, high heat occurs locally, and for this reason, there is a risk where a device is broken or fire occurs.

However, the short circuit prevention layer according to an embodiment of the present specification is located between the auxiliary electrode and the first electrode and acts as a current movement path before the short circuit defect occurs, thereby minimizing an increase in an operating voltage of a device caused by the short circuit prevention layer. Also, when the short circuit defect occurs, only a small amount of current is leaked to a point where short circuit occurs, and thus, efficiency of the organic light emitting device is not degraded, and a device can normally operate.

That is, when the short circuit defect occurs, by applying an appropriate resistance to a movement path of a current flowing to a short circuit defect area, the short circuit prevention layer prevents a current from flowing out through the short circuit defect area.

In detail, the short circuit prevention layer according to an embodiment of the present specification has characteristic where as a temperature increases, a resistance value increases. When short circuit occurs in one area of the organic light emitting device, a high temperature is locally provided by a leakage current, and the resistance of the short circuit prevention layer adjacent to an area, where the short circuit occurs, increases largely. Therefore, the short circuit prevention layer can prevent a current from excessively flowing to the area where the short circuit occurs.

According to the organic light emitting device according to an embodiment of the present specification, when short circuit does not occur, the resistance of the short circuit prevention layer can maintain a low value, thereby minimizing an increase in a driving voltage caused by the short circuit prevention layer.

Moreover, according to the organic light emitting device according to an embodiment of the present specification, there is an advantage where when short circuit occurs, only resistances of some short circuit prevention layers adjacent to an area where the short circuit occurs increase, and thus, a leakage current can be controlled.

According to an embodiment of the present specification, a resistance value of the short circuit prevention layer at 50° C. or more may be two or more times greater than a resistance value at 25° C.

According to an embodiment of the present specification, a resistance value of the short circuit prevention layer at 50° C. or more may be five or more times greater than a resistance value at 25° C.

According to an embodiment of the present specification, the resistance value of the short circuit prevention layer may increase in proportion to a primary function, a secondary function, or an exponential function according to an increase in temperature.

In detail, an embodiment of the present specification provides an organic light emitting device including: a first electrode; a second electrode provided opposite to the first electrode; one or more organic material layers provided between the first electrode and the second electrode; an auxiliary electrode of the first electrode; and a short circuit prevention layer provided between the first electrode and the auxiliary electrode, the short circuit prevention layer having a resistance value which increases in proportion to a primary function, a secondary function, or an exponential function according to an increase in temperature.

The short circuit prevention layer has characteristic where when a temperature of a partial area increases due to occurrence of short circuit, a resistance of an area where a temperature is high increases rapidly. Accordingly, the short circuit prevention layer can effectively control a leakage current.

The resistance value being proportional to the primary function, the secondary function, and the exponential function denotes that a rising curve of a resistance with respect to a temperature represents a shape of each of the functions, but does not denote that the rising curve accurately matches each function.

According to an embodiment of the present specification, the short circuit prevention layer may include a material having electric conductivity of $10^{-7}$ S/cm to $10^3$ S/cm.

In detail, according to an embodiment of the present specification, the short circuit prevention layer may include a material having electric conductivity of $10^{-7}$ S/cm to $10^2$ S/cm.

According to an embodiment of the present specification, the material having the electric conductivity may be a conductive nanoparticle.

According to an embodiment of the present specification, the material having the electric conductivity may include one or more kinds of materials selected from the group consisting of metal, a metal compound, carbon, and a carbon compound.

According to an embodiment of the present specification, the material having the electric conductivity may be metal, such as C, Au, Ag, Ni, Cu, Al, etc., and a compound thereof, but is not limited thereto.

According to an embodiment of the present specification, the material having the electric conductivity may have a spherical shape, a plate shape, a bar shape, or a wire shape.

According to an embodiment of the present specification, a diameter of the material having the electric conductivity may be 200 nm or less. In detail, the material having the electric conductivity may be a nanoparticle having a diameter of 5 nm to 200 nm.

According to an embodiment of the present specification, a content of the material having the electric conductivity may be 10 wt % to 70 wt % with respect to the short circuit prevention layer.

According to an embodiment of the present specification, the short circuit prevention layer may include one or more kinds of materials selected from the group consisting of an inorganic material, an organic material, and a polymer. In detail, the short circuit prevention layer may include a matrix including one or more kinds of materials selected from the group consisting of an inorganic material, an organic material, and a polymer.

According to an embodiment of the present specification, the matrix may be formed of a composition including a photosensitive polymer.

In detail, an embodiment of the present specification provides an organic light emitting device including: a first electrode; a second electrode provided opposite to the first electrode; one or more organic material layers provided between the first electrode and the second electrode; an auxiliary electrode of the first electrode; and a short circuit prevention layer provided between the first electrode and the auxiliary electrode, the short circuit prevention layer including a conductive material and a matrix formed of a composition including a photosensitive polymer.

According to an embodiment of the present specification, the photosensitive polymer may be a positive or negative type photosensitive polymer.

According to an embodiment of the present specification, the photosensitive polymer may have a solubility based on a solvent, which is changed when exposed to light having a wavelength of 400 nm or less.

In detail, according to an embodiment of the present specification, the photosensitive polymer may have a solubility based on a solvent, which increases or decreases when exposed to light having a wavelength of 400 nm or less.

According to an embodiment of the present specification, the short circuit prevention layer may include one or more kinds of materials selected from the group consisting of an inorganic material, an organic material, and a polymer, and the material having the electric conductivity may be distributed in the matrix.

According to an embodiment of the present specification, a thermal expansion coefficient of each of the inorganic material, the organic material, and the polymer may be $10^{-6}$/T or more. In detail, according to an embodiment of the present specification, a thermal expansion coefficient of the matrix may be $50 \times 10^{-6}$ m/m·K or more.

According to an embodiment of the present specification, the short circuit prevention layer may include one or more kinds of materials selected from the group consisting of an inorganic material, an organic material, and a polymer which have electric conductivity of $10^{-2}$ S/cm or more; and one or more kinds of materials selected from the group consisting of metal, a metal compound, carbon, and a carbon compound which have electric conductivity of $10^2$ S/cm or less.

The short circuit prevention layer according to an embodiment of the present specification may be formed of the polymer and the material having the electronic conductivity. The materials which have electronic conductivity and form the short circuit prevention layer are distributed in the polymer, and the conductive nanoparticle enables electricity to flow through the short circuit prevention layer.

Moreover, when a temperature of the short circuit prevention layer increases, the polymer is expanded, and thus, an interval between the materials having electric conductivity distributed in the polymer is enlarged, causing an increase in resistance of the short circuit prevention layer.

A volume expansion of the polymer caused by an increase in temperature is performed without affecting the organic light emitting device. In detail, according to an embodiment of the present specification, the volume expansion of the polymer may be made by less than 10% due to an increase in temperature.

According to an embodiment of the present specification, one end of the short circuit prevention layer may be provided on at least one of a top, a bottom, and a side surface of the first electrode, and the other end of the short circuit prevention layer may be provided on at least one of a top, a bottom, and a side surface of the auxiliary electrode.

According to an embodiment of the present specification, at least a portion of one side surface of the short circuit prevention layer may contact at least a portion of the first electrode, and at least a portion of the other side surface of the short circuit prevention layer may contact at least a portion of the auxiliary electrode.

According to an embodiment of the present specification, the first electrode may include two or more conductive units which are spaced apart from each other.

According to an embodiment of the present specification, each of the two or more conductive units may be electrically connected to the auxiliary electrode through the short circuit prevention layer.

In detail, according to an embodiment of the present specification, in a case where the first electrode includes two or more conductive units which are spaced apart from each other, the short circuit prevention layer may physically contact at least a portion of each of the conductive unit.

In a case where the short circuit prevention layer contacts at least a portion of each of the conductive units, even when a short circuit defect occurs in an area including one conductive unit, the short circuit prevention layer can prevent all of an operating current from flowing to a short circuit defect region. That is, the short circuit prevention layer performs control so that the amount of leakage current caused by the short circuit defect does not infinitely increase. Accordingly, areas including the other conductive units having no short circuit defect can normally operate.

The short circuit prevention layer of the present specification may be provided between the first electrode and the auxiliary electrode, and the first electrode and the auxiliary electrode may not physically contact each other. The first electrode, the short circuit prevention layer, and the auxiliary electrode according to an embodiment of the present specification may be formed in various designs.

Figure 2:
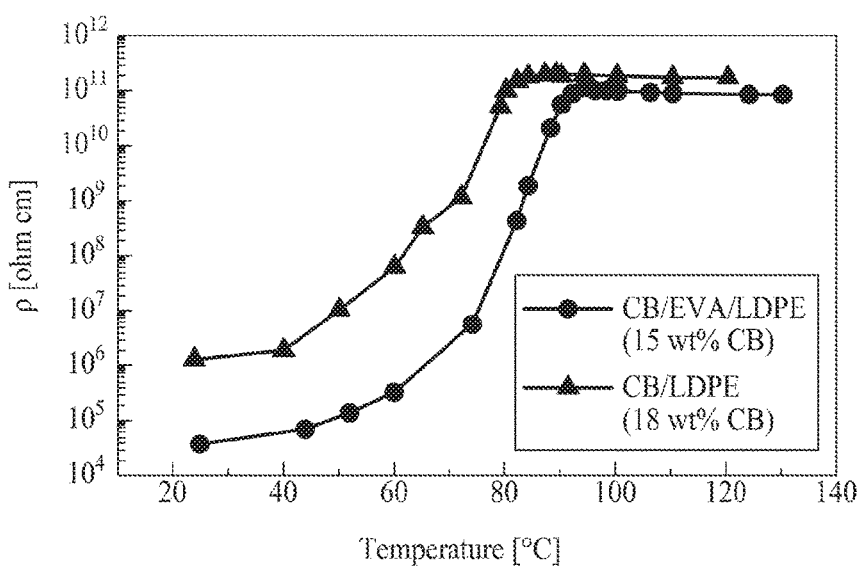
FIG. 2 shows a variation of a resistivity value caused by a temperature change of a short circuit prevention layer according to an embodiment of the present specification.
Figure 3:
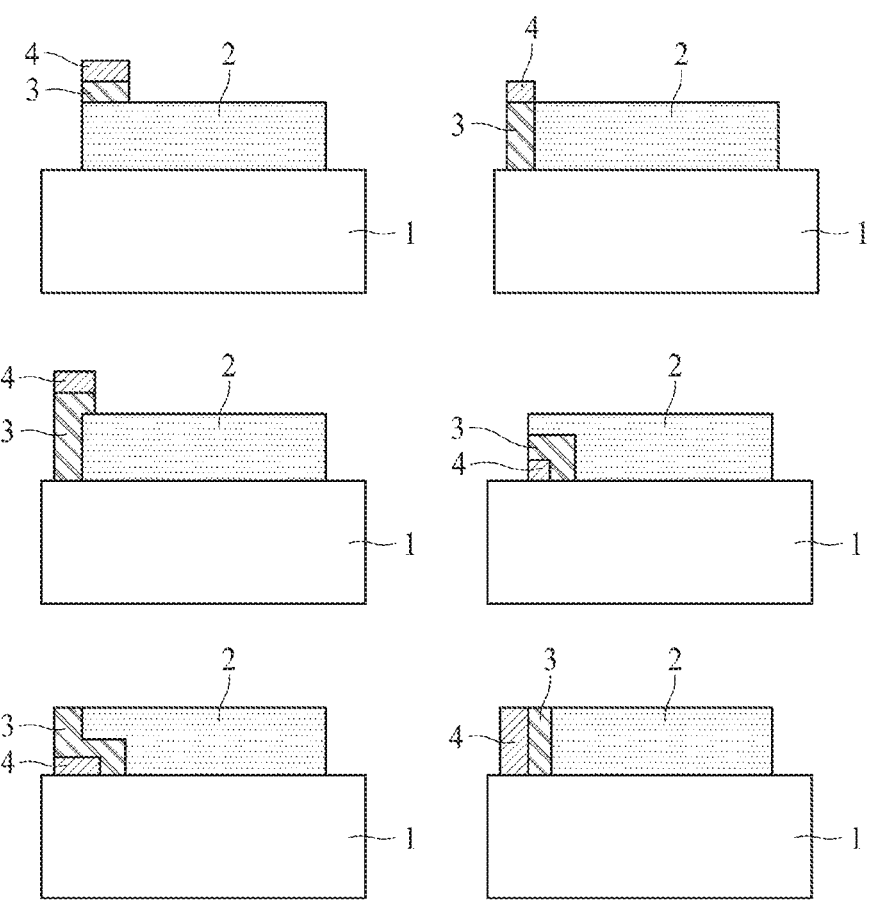
FIG. 3 illustrates a first electrode, an auxiliary electrode, and a short circuit prevention layer provided between the first electrode and the auxiliary electrode on a substrate in an organic light emitting device according to an embodiment of the present specification.

FIG. 3 illustrates a first electrode, an auxiliary electrode, and a short circuit prevention layer provided between the first electrode and the auxiliary electrode on a substrate in an organic light emitting device according to an embodiment of the present specification. In detail, FIG. 3 illustrates a cross-sectional surface of the short circuit prevention layer contacting one area of the first electrode provided on the substrate and a cross-sectional surface of the auxiliary electrode spaced apart from the first electrode. The first electrode of FIG. 3 may be a first electrode which is not patterned. Alternatively, the first electrode of FIG. 2 may denote one conductive unit in the first electrode which is patterned as two or more conductive units.

According to an embodiment of the present specification, the auxiliary electrode may be spaced part from each of the conductive units and may be provided in a mesh structure surrounding one or more the conductive units.

Since the short circuit prevention layer is provided, even in a case where an organic light emitting device operates normally, an intensity of emitted light is relatively reduced due to voltage drop (IR drop), and for this reason, a periphery of a short circuit defect area is darkened. In a case where the auxiliary electrode is provided in the mesh structure, even when voltage drop occurs due to the short circuit defect, a leakage current can flow to a periphery. Therefore, in a case where the auxiliary electrode is provided in the mesh structure, a phenomenon where the periphery of the short circuit defect area is darkened is relaxed.

According to an embodiment of the present specification, a resistance between the adjacent conductive units may be 10 kΩ or less at 25° C. and 50 kΩ or more at 90° C.

The term "adjacent" may denote that some conductive units among two or more conductive units are disposed close to each other.

According to an embodiment of the present specification, a resistance between each of the conductive units and the auxiliary electrode may be 5 kΩ or less at 25° C. and 25 kΩ or more at 90° C.

According to an embodiment of the present specification, the number of the conductive units may be 400 or more.

According to an embodiment of the present specification, the first electrode may be a transparent electrode.

In a case where the first electrode is the transparent electrode, the first electrode may be conductive oxide such as oxide tin indium (ITO) or indium zinc oxide (IZO). Furthermore, the first electrode may be a semitransparent electrode. In a case where the first electrode is the semi-transparent electrode, the first electrode may be formed of a semitransparent metal such as Ag, Au, Mg, Ca, or an alloy thereof. In a case where the semitransparent metal is used as the first electrode, the organic light emitting device may have a micro-cavity structure.

According to an embodiment of the present specification, the auxiliary electrode may be formed of a metal material. That is, the auxiliary electrode may be a metal auxiliary electrode.

The auxiliary electrode may generally use all metals. In detail, the auxiliary electrode may include aluminum (Al), copper (Cu), and/or silver (Ag) which are/is good in conductivity. In a case of using aluminum for an adhesive force to a transparent electrode and stability in a photo process, the auxiliary electrode may use a molybdenum (Mo)/Al/Mo layer.

According to an embodiment of the present specification, the organic light emitting device may further include a substrate provided on a surface opposite to a surface of the first electrode provided with the organic material layer.

The substrate may use a substrate which is good in transparency, surface smoothness, manageability, and waterproofness. In detail, the substrate may use a glass substrate, a thin film glass substrate, or a transparent plastic substrate. The plastic substrate may include a single layer or a multi-layer including films such as polyethylene terephthalate (PET), polyethylene naphthalate (PEN), polyether ether ketone (PEEK), and polyimide (PI), etc. Also, the substrate itself may include a light scattering function. However, the substrate is not limited thereto and may use a substrate which is conventionally applied to organic light emitting device.

According to an embodiment of the present specification, the first electrode may be an anode, and the second electrode may be a cathode. Also, the first electrode may be the cathode, and the second electrode may be the anode.

The anode may use a material which is large in work function, in order for a hole to be smoothly injected into the organic material layer. Examples of a material of the anode available herein may include metals such as vanadium, chromium, copper, zinc, and gold, or an alloy thereof; metal oxide such as zinc oxide, indium oxide, indium tin oxide (ITO), and indium zinc oxide (IZO); a combination of oxide and metal such as ZnO:Al or $SnO_2$:Sb; and conductive polymers such as poly(3-methylthiophene), poly[3,4-(ethylene-1,2-dioxy)thiophene], polypyrole, and polyaniline, but are not limited thereto.

A material of the anode is not limited to only the anode and may be used as a material of the cathode.

The cathode may use a material which is small in work function, in order for an electron to be easily injected into the organic material layer. Examples of a material of the cathode may include metals such as magnesium (Mg), calcium (Ca), sodium (Na), kalium (K), titanium (Ti), indium (In), yttrium (Y), lithium (Li), gadolinium (Gd), aluminum (Al), silver (Ag), tin (Sn), and plumbum (Pb), or an alloy thereof; and a material, having a multi-layer structure, such as LiF/Al or $LiO_2$/Al, but are not limited thereto.

A material of the cathode is not limited to only the cathode and may be used as a material of the anode.

According to an embodiment of the present specification, the organic material layer may include one or more emission layers and may further include one or more layers selected from the group consisting of a hole injecting layer, a hole transporting, a hole blocking layer, a charge generating layer, an electron blocking layer, an electron transporting layer, and an electron injecting layer.

The charge generating layer denotes a layer which generates a hole and an electron when a voltage is applied thereto.

A material of the hole transporting layer according to an embodiment of the present specification is a material which receives a hole from the anode or the hole injecting layer and transports the hole to an emission layer, and a material which is high in mobility of holes is suitable for the material of the hole transporting layer. Detailed examples of the material of the hole transporting layer may include an arylamine-based organic material, a conductive polymer, and a block copolymer including conjugation and non-conjugation, but are not limited thereto.

A material of the emission layer according to an embodiment of the present specification is a material which combines a hole and an electron, respectively supplied from the hole transporting layer and the electron transporting layer, to emit visible light and may be a material which is good in quantum efficiency for fluorescence or phosphorescence. Detailed examples of the material of the emission layer may include 8-hydroxyquinoline aluminum complex ($Alq_3$); carbazole-based compounds; dimerized styryl compounds; BAlq; BAlq; 10-hydroxybenzo quinoline-metal compounds; benzoxazole, benzthiazole and benzimidazole series of compounds; poly (p-phenylene vinylene) (PPV) series polymer; spiro compounds; polyfluorene; and rubrene, but are not limited thereto.

A material of the electron transporting layer according to an embodiment of the present specification is a material which transports an electron, injected from the cathode, to the emission layer, and a material which is high in mobility of electrons is suitable for the material of the electron transporting layer. Detailed examples of the material of the electron transporting layer may include 8-hydroxyquinoline aluminum complex; complex including $Alq_3$; organic radical compounds; hydroxyflavone-metal complex, but are not limited thereto.

According to an embodiment of the present specification, the organic light emitting device may be sealed by an encapsulation layer.

The encapsulation layer may be formed of a transparent resin layer. The encapsulation layer protects the organic light emitting device from oxygen and pollutants and may be formed of a transparent material so as not to obstruct emission of light from the organic light emitting device. Transparency may denote that light is transmitted by 60% or more. In detail, the transparency may denote that the light is transmitted by 75% or more.

According to an embodiment of the present specification, the organic light emitting device may emit white light of 2,000 K to 12,000 K.

FIG. 1 illustrates a plan view and a cross-sectional view of one conductive unit in an organic light emitting device according to an embodiment of the present specification. In detail, FIG. 1 illustrates one conductive unit of a first electrode 2 provided on a substrate 1. In FIG. 1, the reference numeral 3 may refer to a short circuit prevention layer, and the reference numeral 4 may refer to an auxiliary electrode.

FIG. 2 shows a variation of a resistivity value caused by a temperature change of a short circuit prevention layer according to an embodiment of the present specification. As seen in FIG. 2, it can be seen that the short circuit prevention layer according to an embodiment of the present specification shows an exponential curve as a temperature increases, and a resistivity value increases. In detail, CB of FIG. 2 denotes carbon black which is a conductive material of the short circuit prevention layer, LDPE denotes low-density polyethylene, and EVA and LDPE denote a polymer forming the matrix of the short circuit prevention layer.

According to an embodiment of the present specification, the organic light emitting device may include a light scattering layer.

According to an embodiment of the present specification, the organic light emitting device may further include a substrate provided on a surface opposite to a surface of the first electrode provided with the organic material layer, and moreover, may further include an internal light scattering layer provided between the substrate and the first electrode.

According to an embodiment of the present specification, the light scattering layer may include a planarization layer. According to an embodiment of the present specification, the planarization layer may be provided between the first electrode and the light scattering layer.

Alternatively, according to an embodiment of the present specification, the organic light emitting device may further include a substrate provided on a surface opposite to a surface of the first electrode provided with the organic material layer, and moreover, may further include a light scattering layer on a surface opposite to a surface on which the first electrode of the substrate is provided.

According to an embodiment of the present specification, the light scattering layer may use a structure, which induces scattering of light to enhance the light extraction efficiency of the organic light emitting device, without a special limitation. In detail, according to an embodiment of the present specification, the light scattering layer may use a structure where scattering particles are dispersed in a binder, a film having a concave-convex pattern, and/or a film having hazeness.

According to an embodiment of the present specification, the light scattering layer may be directly formed on the substrate by a process such as spin coating, bar coating, or slit coating. Alternatively, the light scattering layer may be manufactured in a film type and may be attached on the substrate.

According to an embodiment of the present specification, the organic light emitting device may be a flexible organic light emitting device. In this case, the substrate may include a flexible material. In detail, the substrate may be a thin film type glass, a plastic substrate, or a film type substrate which is bendable.

A material of the plastic substrate is not specially limited, but generally, the plastic substrate may include a single layer or a multi-layer including films such as polyethylene terephthalate (PET), polyethylene naphthalate (PEN), polyether ether ketone (PEEK), and polyimide (PI).

In the present specification, a display device including the organic light emitting device is provided. In the display device, the organic light emitting device may act as a pixel or a backlight. In addition, elements well known to those skilled in the art may be applied to the display device.

In the present specification, a lighting device including the organic light emitting device is provided. In the lighting device, the organic light emitting device may act as an emission part. In addition, elements well known to those skilled in the art may be applied to the lighting device.

An embodiment of the present specification provides a method of manufacturing the organic light emitting device.

An embodiment of the present specification provides a method of manufacturing the organic light emitting device, which includes: preparing a substrate; forming a first electrode on the substrate; forming an auxiliary electrode of the first electrode on the substrate to be spaced apart from the first electrode; forming a short circuit prevention layer provided between the first electrode and the auxiliary electrode; forming one or more organic material layers on the first electrode; and forming a second electrode on the one or more organic material layers.

According to an embodiment of the present specification, the forming of the short circuit prevention layer may include preparing a composition, including the photosensitive polymer and the conductive nanoparticle, and coating and developing the composition on the substrate.

In detail, the composition may include: the photosensitive polymer; the conductive nanoparticle; and a solvent. The photosensitive polymer, the conductive nanoparticle, and the solvent may be the same as the above-described photosensitive polymer, conductive nanoparticle, and solvent.

According to an embodiment of the present specification, the coating of the composition on the substrate may denote coating the composition on the substrate on which the first electrode is formed.

The method of manufacturing the organic light emitting device according to an embodiment of the present specification may form a short circuit prevention layer in a simple process by using the photosensitive polymer. In detail, the method of manufacturing the organic light emitting device according to an embodiment of the present specification may form the short circuit prevention layer in only a process of coating the composition, irradiating light, and performing development. Furthermore, in a case where the short circuit prevention layer does not use the photosensitive polymer, processes such as photoresist coating based on an etching process, photoresist etching, and removing of a photoresist are additionally needed, causing a problem where process efficiency is reduced and the manufacturing cost increases.

The coating process is not specially limited, but may use a spray process, a roll coating process, a spin coating process, etc. Generally, the coating process widely uses the spin coating process. Also, a coating layer may be formed, and then, depending on the case, some of a remaining solvent may be removed by reducing pressure.

According to an embodiment of the present specification, the forming of the first electrode may include patterning the first electrode.

In the method of manufacturing the organic light emitting device according to an embodiment of the present specification, two or more conductive units may be formed by patterning the first electrode, an auxiliary electrode may be formed to be spaced apart from each of the two or more conductive units, and a short circuit prevention layer may be formed of the composition.

The invention claimed is:

1. An organic light emitting device comprising:
a first electrode;
a second electrode provided opposite to the first electrode;
one or more organic material layers provided between the first electrode and the second electrode;
an auxiliary electrode provided in the first electrode; and
a short circuit prevention layer provided between the first electrode and the auxiliary electrode,
wherein the short circuit prevention layer has a resistance value which is greater at 50 or more ° C. than 25° C., and
wherein a resistance value of the short circuit prevention layer at 50° C. or more is two or more times greater than a resistance value at 25° C.

2. The organic light emitting device of claim 1, wherein the resistance value of the short circuit prevention layer increases in proportion to a primary function, a secondary function, or an exponential function according to an increase in temperature.

3. The organic light emitting device of claim 1, wherein the short circuit prevention layer comprises a material having electric conductivity of $10^{-7}$ S/cm to $10^3$ S/cm.

4. The organic light emitting device of claim 3, wherein the material having the electric conductivity comprises one or more kinds of materials selected from a group consisting of metal, a metal compound, carbon, and a carbon compound.

5. The organic light emitting device of claim 3, wherein a diameter of the material having the electric conductivity may be 200 nm or less.

6. The organic light emitting device of claim 3, wherein a content of the material having the electric conductivity is 10 wt % to 70 wt % with respect to the short circuit prevention layer.

7. The organic light emitting device of claim 3, wherein
the short circuit prevention layer comprises a matrix including one or more kinds of materials selected from a group consisting of an inorganic material, an organic material, and a polymer, and
the material having the electric conductivity is distributed in the matrix.

8. The organic light emitting device of claim 1, wherein the short circuit prevention layer comprises a matrix including one or more kinds of materials selected from a group consisting of an inorganic material, an organic material, and a polymer.

9. The organic light emitting device of claim 8, wherein the matrix is formed of a composition including a photosensitive polymer.

10. The organic light emitting device of claim 8, wherein a thermal expansion coefficient of the matrix is $50 \times 10^{-6}$ m/m·K or more.

11. The organic light emitting device of claim 1, wherein the short circuit prevention layer comprises one or more kinds of materials selected from a group consisting of an inorganic material, an organic material, and a polymer which have electric conductivity of $10^{-2}$ S/cm or more; and one or more kinds of materials selected from a group consisting of metal, a metal compound, carbon, and a carbon compound which have electric conductivity of $10^2$ S/cm or less.

12. The organic light emitting device of claim 1, wherein one end of the short circuit prevention layer is provided on at least one of a top, a bottom, and a side surface of the first electrode, and the other end of the short circuit prevention layer is provided on at least one of a top, a bottom, and a side surface of the auxiliary electrode.

13. The organic light emitting device of claim 1, wherein the first electrode comprises two or more conductive units spaced apart from each other.

14. The organic light emitting device of claim 13, wherein each of the two or more conductive units is electrically connected to the auxiliary electrode through the short circuit prevention layer.

15. The organic light emitting device of claim 13, wherein the auxiliary electrode is spaced part from each of the conductive units and is provided in a mesh structure surrounding one or more the conductive units.

16. The organic light emitting device of claim 13, wherein a resistance between the adjacent conductive units is 10 kΩ or less at 25° C. and 50 kΩ or more at 90° C.

17. The organic light emitting device of claim 13, wherein a resistance between each of the conductive units and the auxiliary electrode is 5 kΩ or less at 25° C. and 25 kΩ or more at 90° C.

18. The organic light emitting device of claim 1, further comprising:
   a substrate provided on a surface opposite to a surface of the first electrode provided with the organic material layer; and
   an internal light scattering layer provided between the substrate and the first electrode.

* * * * *